(12) United States Patent
Venkatesan et al.

(10) Patent No.: US 7,941,726 B2
(45) Date of Patent: May 10, 2011

(54) LOW DIMENSIONAL SPECTRAL CONCENTRATION CODES AND DIRECT LIST DECODING

(75) Inventors: Ramarathnam Venkatesan, Redmond, WA (US); Adi Akavia, Ramat Hasharon (IL)

(73) Assignee: Microsoft Corporation, Redmond, WA (US)

( * ) Notice: Subject to any disclaimer, the term of this patent is extended or adjusted under 35 U.S.C. 154(b) by 984 days.

(21) Appl. No.: 11/772,049

(22) Filed: Jun. 29, 2007

(65) Prior Publication Data

US 2008/0126910 A1    May 29, 2008

Related U.S. Application Data

(60) Provisional application No. 60/921,469, filed on Jun. 30, 2006.

(51) Int. Cl.
*H03M 7/00* (2006.01)
*H03M 13/05* (2006.01)

(52) U.S. Cl. .......................................... 714/752; 380/28
(58) Field of Classification Search ................ 714/752; 380/28
See application file for complete search history.

(56) References Cited

U.S. PATENT DOCUMENTS

| 5,297,206 | A | * | 3/1994 | Orton | 380/30 |
| 6,038,315 | A | * | 3/2000 | Strait et al. | 713/183 |
| 6,081,597 | A | * | 6/2000 | Hoffstein et al. | 380/28 |
| 6,154,541 | A | * | 11/2000 | Zhang | 380/28 |
| 7,802,904 | B2 | * | 9/2010 | Son | 362/297 |
| 2005/0117745 | A1 | * | 6/2005 | Lee et al. | 380/30 |
| 2007/0248249 | A1 | * | 10/2007 | Stoianov | 382/124 |

* cited by examiner

*Primary Examiner* — Stephen M Baker
(74) *Attorney, Agent, or Firm* — Lee & Hayes, PLLC

(57) ABSTRACT

Systems and methods provide an optionally keyed error-correcting code that is spectrally concentrated. Each codeword of the low dimensional spectral concentration code (LDSC code) typically has very few coefficients of large magnitude and can be constructed even with limited processing resources. Decoding can be performed on low power devices. Error-correcting code is constructed around a key using basic computer arithmetic for computations instead of finite field arithmetic, thus saving energy. A recipient who possesses the key enjoys correction of a relatively high percentage of noise errors. In one implementation, a direct list-decoder iteratively estimates a list of message words directly, instead of a list of codewords. In variations, a unique message word is selected from the list either by applying a randomness test or by using message passing.

20 Claims, 7 Drawing Sheets

600 ⇘

RECEIVE ENCODED DATA THAT HAS BEEN SUBJECTED TO NOISE
602

↓

APPLY RANDOMIZED FOURIER TRANSFORM ON LARGEST COEFFICIENTS OF THE ENCODED DATA TO DECODE THE ENCODED DATA INTO A LIST OF ESTIMATIONS OF THE ORIGINAL DATA
604

↓

SELECT ONE OF THE ESTIMATIONS TO REPRESENT THE DATA E.G., BASED ON A RANDOMNESS TEST THAT COMPARES ERROR VECTORS TO AN ERROR PROBABILITY
606

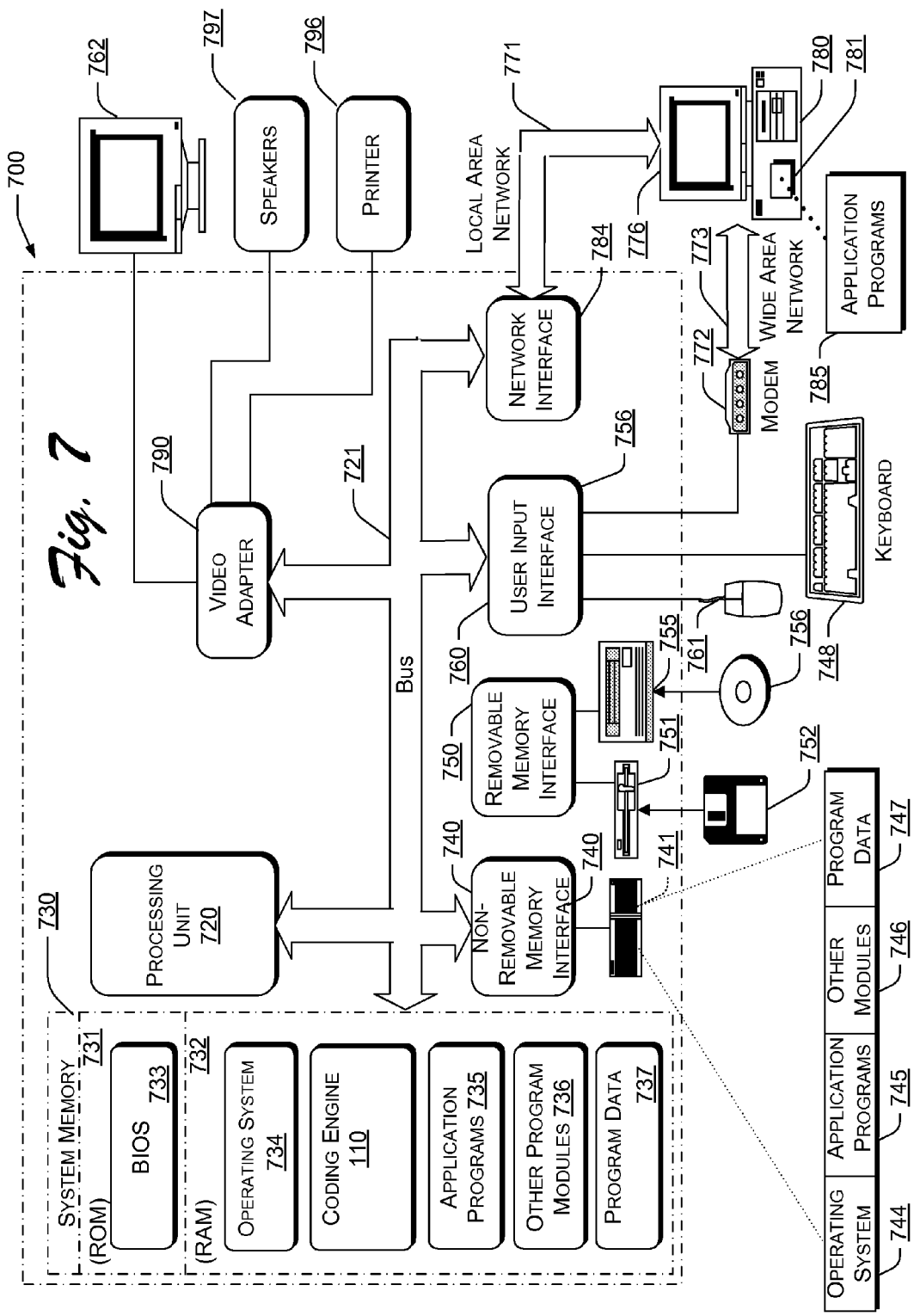

LOW DIMENSIONAL SPECTRAL CONCENTRATION CODES AND DIRECT LIST DECODING

RELATED APPLICATIONS

This application claims priority to copending U.S. Provisional Patent Application No. 60/921,469 to Venkatesan et al., filed Jun. 30, 2006.

BACKGROUND

Error-correcting codes can be used for carrying message data over a noisy channel. Such codes have built-in patterning, parity checks, and/or redundancy. If the noise is not too great, then corrupted codewords in the received signal can be repaired to recover the original message data, sometimes with guaranteed reliability. There is a theoretical limit to the amount of corruption that can be reversed. Codes constrained to output a single unique codeword for each input message word can typically correct up to d/2 errors, where d is the "minimum distance" of the code, i.e., such that any two encodings of two different messages differ in at least d positions. For example, some error-correcting codes might unambiguously recover up to 25% of errors in trying to decode the original message word.

List-decoding, on the other hand, compares the received corrupted codeword with codewords from within a radius of similarity. The degree of similarity for searching for potential matches among the known codewords is referred to as the "Hamming distance." List-decoding allows recovery from noise levels significantly higher than the noise levels allowing unique decoding, and is therefore used when the noise level is so high that unambiguous decoding is not possible. Theoretically such binary codes can correct up to nearly 50% of the errors of a corrupted codeword. List decoding has attracted a lot of attention in the literature.

Reed-Solomon codes are widely used. They are block-based error-correcting codes that are based on a technique of evaluating polynomials at selected points in a finite field where the polynomials are constructed from the original message data. The number of such evaluations are more than would be strictly necessary to reconstruct the polynomial under ideal conditions from some of its samples, this oversampling allows the polynomial to be recovered correctly even if (not too many) samples become corrupted from noise in the transmission channel. Reed-Solomon codes are often used in compact disc (CD) and DVD technology.

McEliece type cryptosystems use asymmetric key paradigms, but in pure form have never gained wide use due to some inherent disadvantages when compared with the systems in wide use. The algorithms use Goppa codes, a type of error-correcting code. Goppa codes are relatively easy to decode, but distinguishing them from a random linear code is considered difficult—this indistinguishability forms the basis of their use in McEliece cryptosystems, since decoding random linear codes is believed to be hard. The keys created can be a public and private key pair of the public key infrastructure (PKI). The usual disadvantage is that the private and public keys are large matrices. A public key can be very large. There have been some partial attempts to cryptanalyze McEliece systems, but none have been successful. However, the pure algorithm is rarely used in conventional practice because of the relatively large keys and because the ciphertext is twice as large, with respect to conventional parameters, as the plaintext.

Nonetheless, a McEliece system typically consists of three parts: probabilistic key generation steps that produce a public and a private key; probabilistic encryption steps; and deterministic decryption steps.

Users in a McEliece implementation thus share a set of common security parameters: message length k, codeword length n, and number of errors that can be corrected t. Conventional values for these parameters are k=644; n=1024, and t=38. During McEliece key generation:

Users select a binary (n, k)-linear code C capable of correcting t errors. This code usually possesses an efficient decoding algorithm.

User "Alice" generates a k×n generator matrix G for the code C.

The generator selects a random k×k binary non-singular matrix S.

The generator selects a random n×n permutation matrix P.

The generator computes the k×n matrix $\hat{G}$=SGP.

Alice's public key is ($\hat{G}$,t); her private key is (S, G, P).

For message encryption, when "Bob" wishes to send a message m to Alice whose public key is ($\hat{G}$,t):

The encoder encodes the message which is a binary string of length k.

The encoder computes the vector c'=m$\hat{G}$.

The encoder generates a random n-bit vector z containing at most t ones.

The encoder computes the ciphertext as c=c'+z.

For message decryption:

The decoder computes the inverse of P, that is, $P^{-1}$,

The decoder computes $\hat{c}$=c$P^{-1}$.

The decoder uses the decoding algorithm for the code C to decode $\hat{c}$ to $\hat{m}$.

The decoder computes message m=$\hat{m}S^{-1}$.

The McEliece type cryptosystems are even more impractical for small devices with very low power because one must expend more computing resources on decoding and encoding over finite fields than would be needed for more popular coding algorithms such as low density parity check codes and Turbo codes.

SUMMARY

Coding systems and methods provide security via an error-correcting code that is spectrally concentrated (low dimensional spectral concentration—LDSC—code) and can be encoded and decoded even with limited processing resources. Decoding can be performed on low power devices, such as handheld devices and smart cards. In one implementation, error-correcting code is constructed around an optional key using basic computer arithmetic for computations (e.g., instead of finite field arithmetic), thus saving processing energy. A recipient who possesses the key enjoys correction of a relatively high percentage of noise errors. An exemplary transform, such as a character transform, is applied that can decode in an energy-efficient manner such that the recipient establishes a list of message candidates based on large transform coefficients corresponding to candidate codewords. In some implementations, the transform is described as a special randomized Fourier transform ("SRFT"). The transform is defined over the space of binary strings viewed as a vectors over finite field of characteristic two, and using character $\chi_a(x)=(-1)^{<a,x>}$, where the <,> notation is used to denote standard inner-product of vectors. In one implementation, a decoder iteratively creates a list of plaintext messages (or even parts of a message) instead of a list of codewords. In variations, a unique message word is selected from the list either by applying a randomness test or by using message passing methods for decoding.

To construct a good code an exemplary system selects certain vectors from a set of low dimensional subspaces and adds appropriately selected random vectors to scatter them over larger subspaces and thus achieves good characteristics of the code, including manners of decoding it.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 7 is a block diagram of an exemplary computing device suitable for practicing the subject matter.

DETAILED DESCRIPTION

Overview

Figure 1:
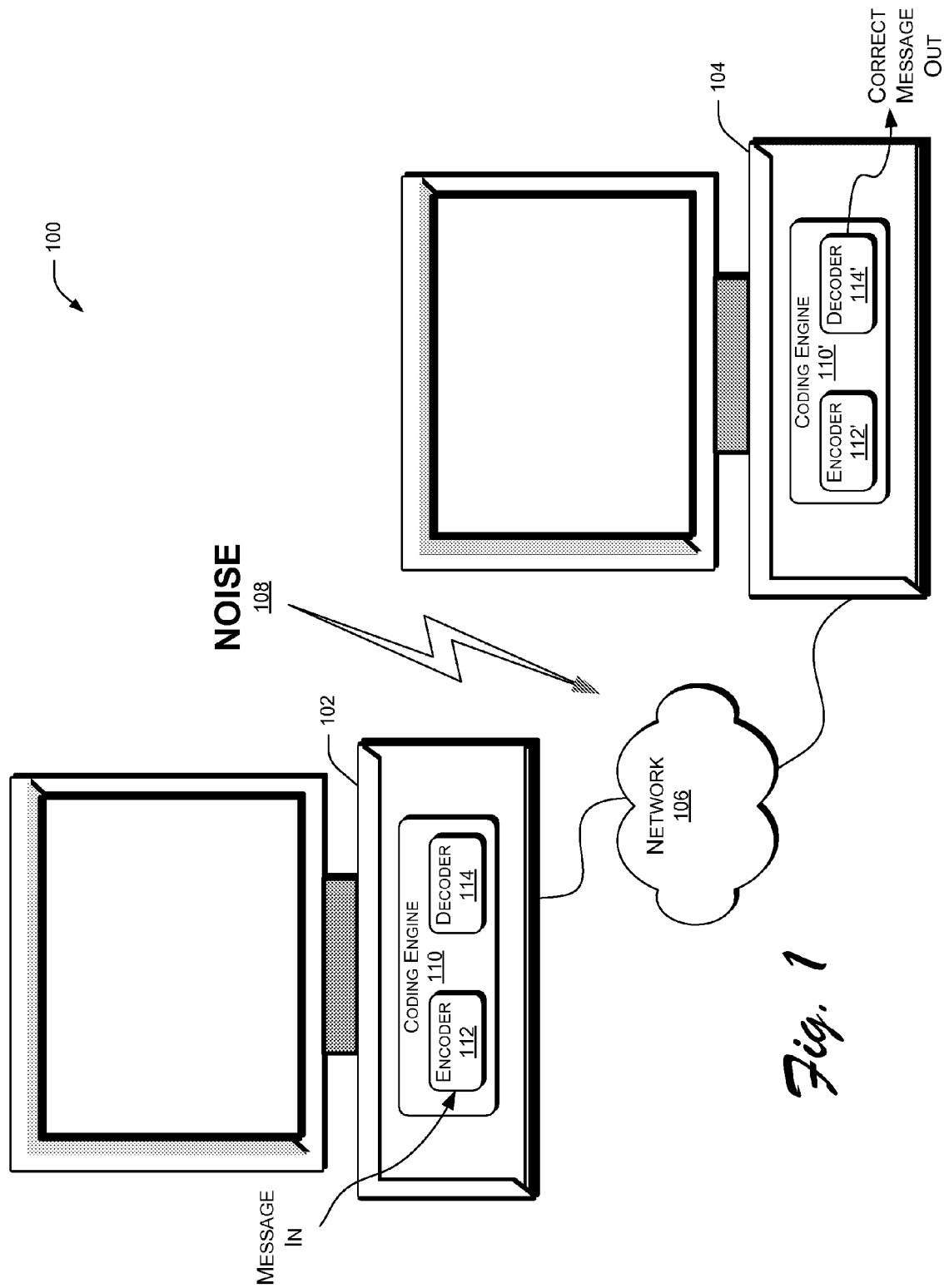
FIG. 1 is a diagram of an exemplary coding and decoding schema.

Described herein are systems and methods that use reduced energy to construct (as well as encode and decode) a low dimensional spectral concentration (LDSC) code, which in one implementation may be transmitted over noisy channels and then list-decoded by a receiver with limited power resources to correctly obtain the original message, even when the channel noise and data errors are relatively high. For example, the constructed code can be used to list-decode to polynomially sized (whose lengths are bounded by a constant power of $1/\epsilon$) lists for error probability of $\frac{1}{2}+\epsilon$.

In what follows, for convenience codes will be described whose generator matrix will be subjected to an optional transform that is similar to the ones in McEliece systems to make the generator matrix look random (unless one knows the transform, which is a secret). Encoding and decoding is described for such a system when the optional transform is present for encrypting and decrypting.

In one option, the exemplary LDSC code can be used to achieve an efficient McEliece type encryption. An exemplary encryptor using the McEliece style cryptosystem encrypts secure code suitable for list-decoding around a random key, so that a key holder can overcome relatively high levels of noise but a user who does not have the key cannot recover from the corruption. The McEliece cryptographic schema thus based on the exemplary LDSC error-correcting code may even add errors to the ciphertext as part of the encryption process. An exemplary decryption schema to be described below can be executed whether or not the error vector is from natural transmission errors.

The exemplary encoder and decoder described herein can run on low-energy devices such as smart cards and low-power handheld computers by using standard computer arithmetic—simple real numbers and integers—instead of conventional finite field arithmetic. Simplified techniques and computations reduce processing power requirements. LDSC code is spectrally concentrated (i.e., the low dimensional subspace code satisfies that each codeword has typically very few coefficients of large magnitude). For example, an exemplary "sampling" technique improves the rate (i.e., the efficiency) of each codeword. In one implementation, rather than define each the encoding of x as a codeword $C_x$ with the value of $(-1)^{<x, y+z>}$ over all the y in $V_i$, the technique does so only for a random subset of y's. Here $V_i$ is a randomly chosen small dimensional subspace of n the dimensional subspace.

An exemplary decoding technique saves power also by directly outputting a list of message words (or parts of the message bits) instead of a list of codewords that would still require processing power to decrypt before the step of finding a best-match codeword from the list. However, exemplary techniques can also be used when the codeword is found first before finding the message.

In one implementation, a likely correct message word is selected by applying a randomness test during list-decoding. Another implementation uses message passing for the selection task.

Exemplary System

FIG. 1 shows an exemplary computing system 100 providing an example environment for the subject matter to be described. The shown computing system 100 includes a first user 102 and a second user 104 communicatively coupled via a network 106, for example, the Internet. Various segments of the network 106 may consist of physical links—wireless, cable, fiber optic, telephone, satellite, etc., and their respective interfaces—that may at times have faulty transmission or may be subject to data drop-outs, corruption, and interference due to overload, switching errors, and noise 108. Data corruption may also be caused by faulty or low quality equipment in a user's home, problems at the Internet Service Provider, and so forth.

Each user may include an exemplary coding engine 110, which in turn may include an encoder 112 and a decoder 114. By enlisting techniques, in some applications, such as ones that assume random noise errors, the coding engine 110 can effectively double, in some applications, the error-correcting capability of codes that find a (single) closest codeword. Optionally, security can be added by enlisting an encryption-decryption secret, such as a PKI key pair set, while maintaining low power consumption enabled by using the exemplary LDSC code. For example, a McEliece type cryptosystem can optionally be used to provide keys for the exemplary coding engine 110 because an exemplary coding technique reduces the amount of data required for representing the LDSC code (e.g. uses bits instead of elements of a finite field extensions) and simplifies computation (e.g., it uses operations over bits instead operations over finite field extensions). That is, an exemplary coding method utilizes a McEliece framework which is viable for small, battery operated devices.

A more detailed description of components of the example computing system 100 is provided with respect to FIG. 7, below.

Figure 2:
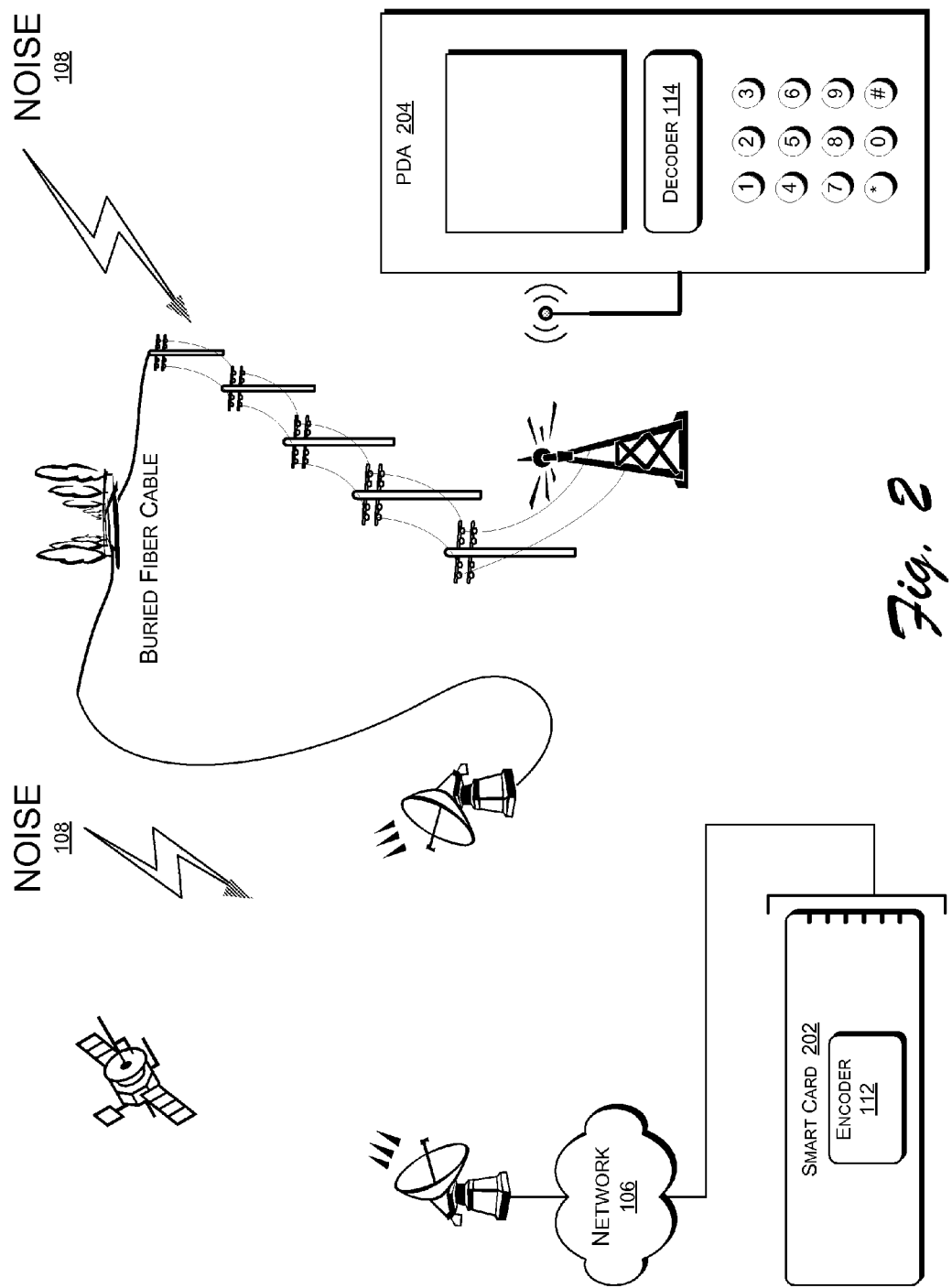
FIG. 2 is a diagram of the exemplary coding and decoding schema suitable for use on low power devices.

FIG. 2 shows another environment for the described subject matter. A smart card 202 includes an exemplary encoder 112. The encoder 112 constructs a codetext that can be list-decoded when transmitted to a recipient if the recipient, for example a user of a personal digital assistant (PDA) 204, has the key. The communication channel between smart card 202 and recipient PDA 204 may be subject to noise as various segments of the communication channel consist of wireless telephone links, buried fiber, satellite link, switches, etc. The smart card 202 with its limited resources is able to generate the codetext and optional keys, because exemplary code generation techniques employ energy saving techniques. Likewise, due to the low energy requirements for processing the spectrally concentrated code, a smart card 202 can also decode the LDSC code, even though the energy resources of the smart card 202 are very limited.

Exemplary Encoder

Figure 3:
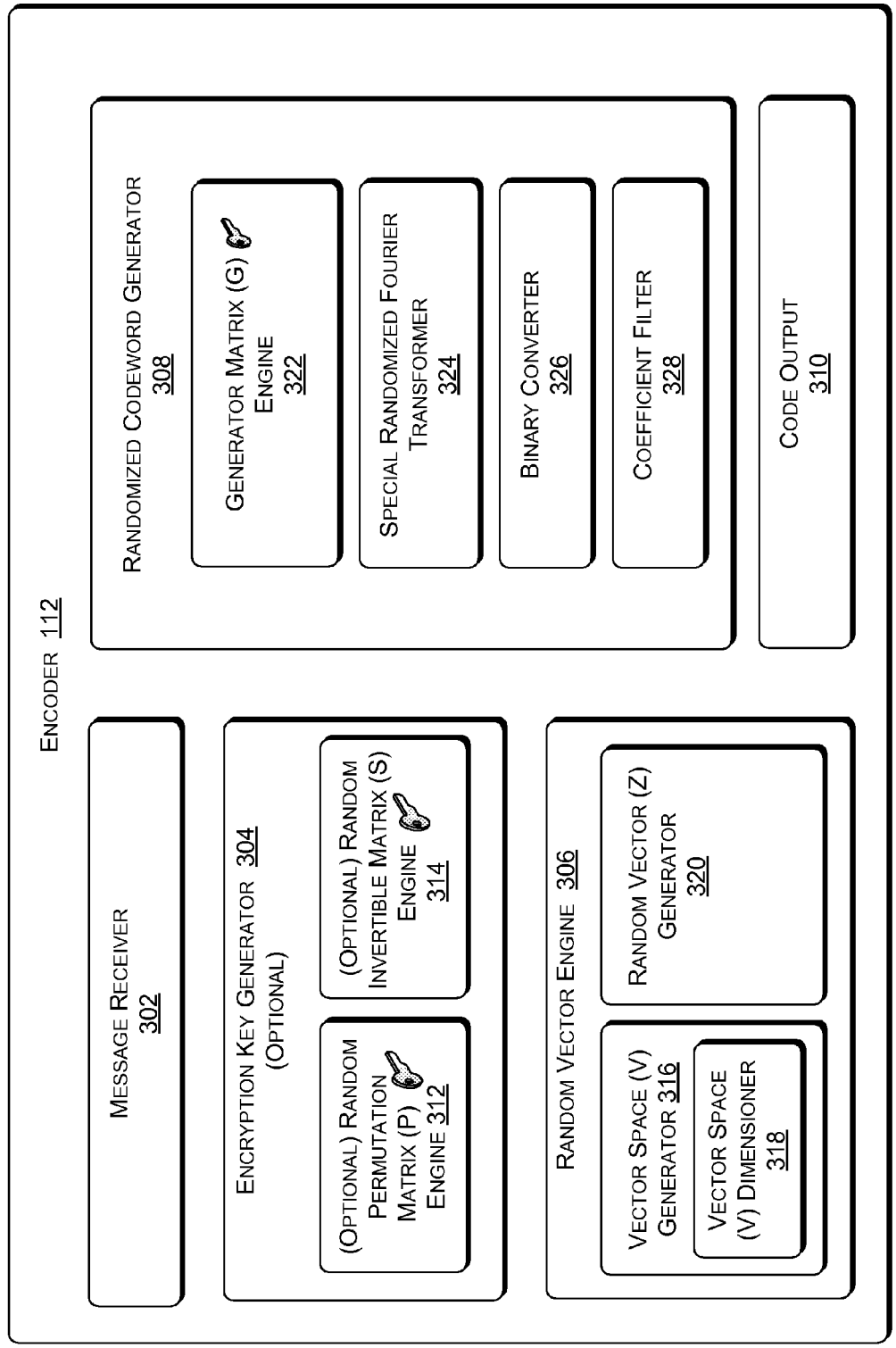
FIG. 3 is a block diagram of an exemplary encoder.

FIG. 3 shows the exemplary encoder 112 of FIGS. 1 and 2 in greater detail. The illustrated configuration of the exemplary encoder 112, capable of constructing (i.e., encoding) the exemplary LDSC energy-efficient code, is meant to provide only one example arrangement for the sake of overview. Many other arrangements of the illustrated components, or similar components, are possible within the scope of the subject matter. Such an exemplary encoder 112 can be executed in hardware, software, or combinations of hardware, software, firmware, etc.

In the illustrated implementation, the encoder 112 may include a message receiver 302, an optional encryption key generator 304, a random vector engine 306, a randomized codeword generator 308, and a codeword output 310. In implementations that optionally use encryption keys, the encryption key generator 304 may further include a random permutation matrix (P) engine 312 (optional) and a random invertible matrix (S) engine 314 (optional). Conventional public key encryption schemata, PKI, etc., can be used.

The random vector engine 306 may further include a vector space (V) generator 316 having a vector space dimensioner 318, and a random vector (Z) generator 320.

The randomized codeword generator 308 further includes a code generator matrix (G) engine 322 and an exemplary special randomized Fourier transform (SRFT) engine 324, e.g., to impart code characteristics that will allow a user-recipient to apply an SRFT during decoding. The randomized codeword generator 308 may also further include a binary converter 326 and a coefficient filter 328. In variations of the exemplary encoder 112, some of the components listed above may be combined with each other differently, or may be inherent in the logic fabric of other components or of the encoder 112 itself, as a whole.

Each message word x will be coded into a corresponding codeword $C_x$, where $x \in \{0, 1\}^n$. (That is, each message word is binary, each digit consisting of 1's and 0's).

Optional Key Generator

In implementations that use an optional key schema, the random permutation matrix (P) engine 312 selects a random permutation matrix (P). Likewise, the random invertible matrix (S) engine 314 selects a random binary non-singular matrix (S). Matrix (P) and matrix (S) can be components of a private key, along with generator matrix (G), to be described below. The public key $(\hat{G}, t)$ where $\hat{G}=(S)(G)(P)$, however, is published to everyone.

Random Vector Generation

The random vector engine 306 computes binary vectors. In one implementation, $e_1, e_2, \ldots, e_k$ is a basis for $\{0, 1\}^k$. The vector space (V) generator 316 and dimensioner 318 compute b vector spaces $V_1, V_2, \ldots, V_b$ whose bases are subsets of $e_1, e_2, \ldots e_k$. For dimensions of each vector $V_i$: $\dim(V_i)=d_i$, and we specify it within small constant factors as $d_i=\log(k)$ or $d_i<(\log(k)+\text{constant})$ or $d_i \leq 1/\epsilon^2$ or randomly distributed in between 1 and $\log(k)$. The choice depends on specific application. In one implementation, b can be set equal to $k/\log(k)$. During encoding, the random vector (Z) generator 320 computes s random n-bit vectors: $z_1, z_2, \ldots z_s$, which are randomly selected from $\{0, 1\}^k$. In one implementation, each vector z includes at most t ones ("1s"). In one implementation, $s=10/\epsilon^2$, where the code constructed by the encoder 112 can be used to list-decode to polynomially sized lists for (transmission) error probability of $1/2+\epsilon$.

Exemplary Encoder

The randomized codeword generator 308 generates energy-efficient, spectrally concentrated code that is optionally key-protected and that in one implementation can be list-decoded by a recipient.

First, during encryption key generation, the generator matrix (G) engine 322 has created a generator matrix (G). (This can be done concurrently with the generation of the other matrices (P) and (S) by the encryption key generator 304.)

In one implementation, the codeword generator 308 defines $C_x$ as a function, i.e., over the domain specified by Equation (1):

$$\{v+z_j : v \in V_i, 1 \leq i \leq b, 1 \leq j \leq s\} \to \pm 1\}, \qquad \text{Equation (1)}$$

such that $C_x(v+z)$ is defined as in Equation (2):

$$C_x(v+z)=(-1)^{<x,v+y>}. \qquad \text{Equation (2)}$$

The codeword generator 308 then encodes a codeword x to $C_x$, a binary string of length n. The exponent $<x, v+y>$ in Equation (2) equals 0, 1, (or possibly some other integer), but $C_x$ will either be equal to "1" or "−1." The binary converter may change "−1" output to zeroes eventually.

Exemplary Decoder

Figure 4:
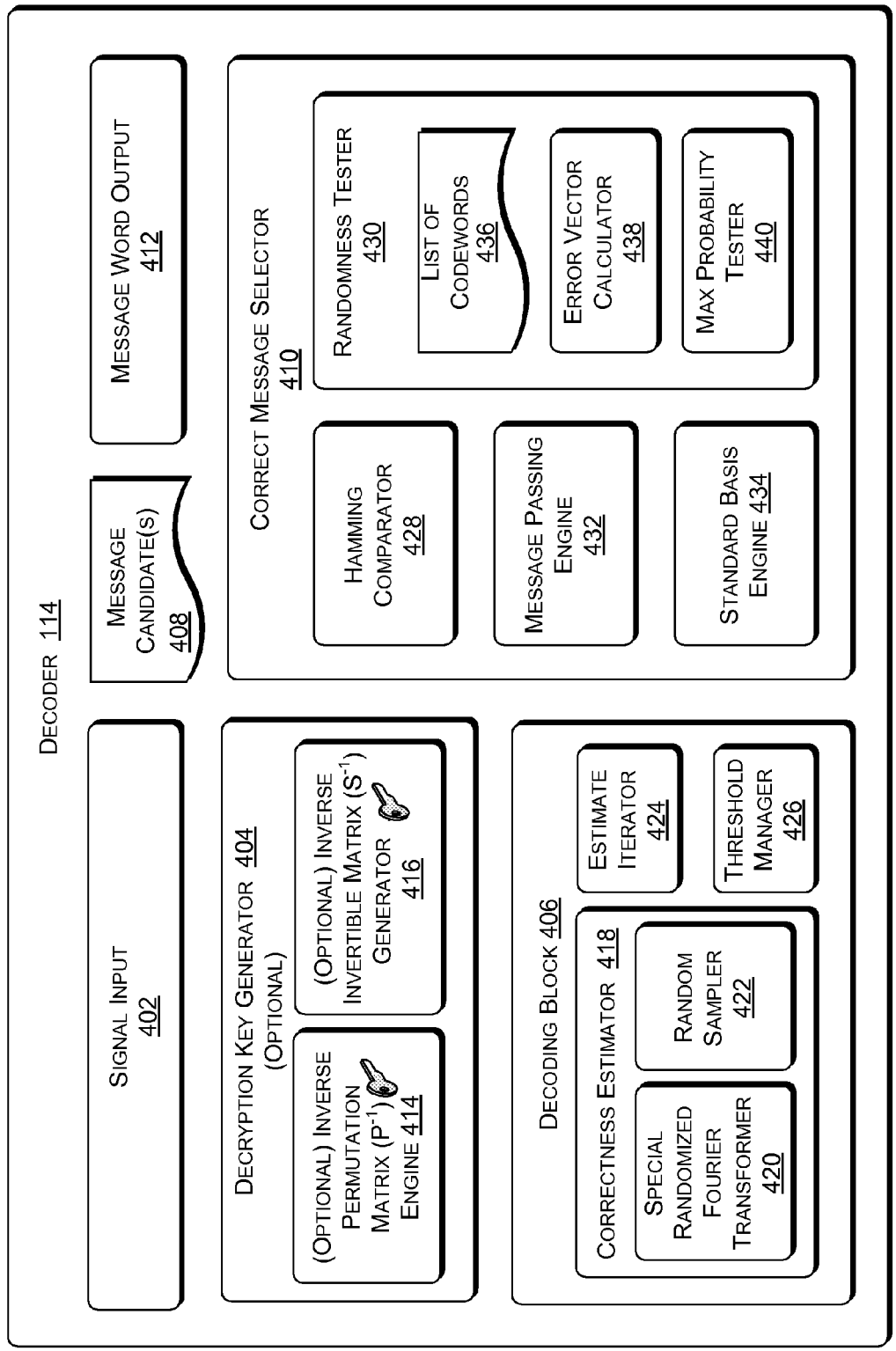
FIG. 4 is a block diagram of an exemplary decoder.

FIG. 4 shows the exemplary direct decoder 114 of FIGS. 1 and 2 in greater detail. The exemplary decoder 114 processes the exemplary spectrally condensed (LDSC) code at low energy cost. The illustrated configuration of the exemplary decoder 114 is meant to provide only one example arrangement for the sake of overview. Many other arrangements of the illustrated components, or similar components, are possible within the scope of the subject matter. Such an exemplary decoder 114 can be executed in hardware, software, or combinations of hardware, software, firmware, etc.

The exemplary direct list-decoder 114 includes a signal input 402, an optional decryption key generator 404 (needed only if the application has an encoder that employs encryption), a decoding block 406, a buffer for a (list of) message candidate(s) 408, a correct message selector 410, and a message word output 412. The decryption key generator 404 may further include an inverse permutation matrix engine 414 (optional) and an inverse invertible matrix engine 416 (optional). The decoding block 406 may include a correctness estimator 418, a transform-based estimator 420, a random sampler 422, an estimation iterator 424, and a threshold manager 426.

The correct message selector 410 may further include a Hamming comparator 428, a randomness tester 430, a message passing engine 432, and a standard basis engine 434. The randomness tester 430 further includes a buffer for a list of codewords 436 (e.g., the list may contain few codewords, one codeword or none), an error vector calculator 438, and a maximum probability tester 440. In variations of the exemplary decoder 114, some of the components listed above may be combined differently with each other, or may be inherent in the logic fabric of other components or of the decoder 114 itself.

Exemplary Noise Analysis

At the signal input 402, the signal from the encoder 112 has been transmitted over the various transmission modalities illustrated in FIGS. 1-2, and may have been modified by "addition" of noise "η" 108 and other transmission errors along the channel. These affect the signal by causing one or more bits to flip to the opposing value. Thus, instead of receiving a codeword $C_x$, the decoder 114 is likely to receive $C_x \cdot \eta$. Since the code output is representative of only positive ones "+1" and negative ones "−1s," the difference between a correct bit and an erroneously flipped bit is actually the positive or negative sign of the "1" integer. In other words, a received codeword w, whether it has one or more incorrect bits or not, can be represented as $w=C_x\cdot\eta$, where the probability of $\eta$ being +1 is $\frac{1}{2}+\epsilon$ while the probability of $\eta$ being −1 is $\frac{1}{2}-\epsilon$ for a noise parameter $\epsilon\in[0, \frac{1}{2}]$.

Decoding the Received Signal

In implementations that use keys, the inverse permutation matrix engine 414 generates $P^{-1}$, and the inverse invertible matrix engine 416 generates $S^{-1}$. These are used for decryption.

In general, the decoding block 406 decodes potentially corrupted codeword w to arrive "directly" at a list (408) of message word candidates, one of which is to be selected as the best candidate for being the original message word.

To perform the "direct" list-decoding, the correctness estimator 418 begins with E, an empty set of equations. Then, the transform-based estimator 420 may use a special randomized Fourier transform (SRFT) to find candidate codewords within a certain distance of the received (noisy) codeword w. More specifically, in one implementation the following steps are iterated:

for i = 1 to b do
   for $\alpha \in V_i$ do $$\text{Let est} = \Sigma_z \Sigma_{y_1, y_2 \in V_i} w(y_1 + z) w(y_2 + z) \chi_\alpha(y_1 + y_2) \quad \text{Equation (3)}$$

if est $\geq 3/4 \cdot \epsilon$ then                             Equation (4)
        Add to E, the equation $\pi_{V_i}(x) = \alpha$      Equation (5)
     end if
   end for
end for The above formula is for the subspace $V_i$. The same z's are not used in all $V_i$'s i=1 ... b. Instead random z's are selected independently for each $V_i$. A set of samples can be used instead of summing over all y's entire subspaces $V_i$. Also, another code can be employed to encode messages and these codes will be the message.

From this flow, the set of all x that are solutions of a subset of E taking (at most) one equation per each subspace $V_i$ are the list of message candidates 408. Unlike conventional list-decoding, the set of all x are messages that are candidates for the original message word x. Conventional list-decoding returns a list of codewords, not messages. Each codeword in a conventional list must be mapped back to the original message word. Such a conventional mapping step may require a great deal of extra processing energy, which the exemplary direct list-decoder 114 saves.

In one implementation, the inner summation of Equation (3) may be replaced with a random sampler. In another implementation, the list of message candidates 408 is fed back into Equations (3)-(5) to iteratively hone accuracy of the results. If est$\geq 3/4\cdot\epsilon$, then the equation $\pi_{V_i}(x)=\alpha$ for a given $V_i$ and $\alpha$ is stored. The x of each stored equation is an estimation of the original message data.

The threshold manager 426 allows adjustment of the $3/4\cdot\epsilon$ threshold in Equation (4).

Selecting a Best Word Match

The correct message selector 410 identifies a "best match" (unique message) word from the list of message candidates 408 that has been output from the decoding block 406. The best match is the word in the list that is most likely to be the correct message word.

In one implementation, for each word in the list of message candidates 408, the Hamming comparator 428 finds message words within a given Hamming radius of each candidate in the list of message candidates 408. A q-ary error-correcting code $C \subseteq \{1, 2, \ldots, q\}^n$ is list-decodable to radius $\rho$ with list size L if each Hamming circle of radius $\rho$ contains at most L codewords of C. Whereas the list of message candidates 408 may be compiled by capturing each message word within a certain distance of a corrupted word, the Hamming comparator 428 compares each distance of the various captured words with each other, if possible, to determine if one of the distances stands out as being characteristic of the correct word, e.g., a shorter distance or is remarkable in some other manner that indicates the best match.

In one implementation, the randomness tester 430 has an error vector calculator 438 to determine error vectors, $e=C_x\cdot w$, by comparing each received codeword w with each associated codeword $C_x$ from a list of codewords 436. The maximum probability tester 440 estimates a probability of how close the error vector e is to the error distribution. The closeness result is then used to select the best message x from the list of message candidates 408. Thus, in one implementation:

for x $\in$ L do $$p = \text{runtest}(Cx \cdot w, 0) \quad \text{Equation (6)}$$

end for

Equation (6) finds the number of mean crossings of the random variable or other suitable random statistic used in standard randomness tests. The randomness tester 430 then selects the x that has maximum probability p.

In another implementation, the message passing engine 432 corrects errors in the "est" estimate of Equation (3) to yield a better rate of channel usage for the code. That is, since "est" is just an estimate of the correctness of Equation (5), i.e., $\pi_{V_i}(x)=\alpha$, message passing techniques are used to correct errors in this estimate, in this example implementation.

In another variation, the standard basis engine 434 removes the need for Gaussian elimination in processing the equations that qualify for E in Equations (4) and (5) above, by selecting the standard basis. This causes the Equation (5): $\pi_{V_i}(x)=\alpha$, to provide some bits of message x directly. For example:

for b $\in$ basis(Vi) do
   < x,b >=< $\alpha$,b >
end for

Since b is one element of the standard basis, this provides a bit of message x directly.

Variations of the Exemplary Encoding

In one alternative implementation, the random vector engine 306 selects vector z such that for each vector space $V_i$, a large number of co-sets of each vector space results.

The random sampler 422 may replace the inner summation process of Equation (3)—(for determining an estimation, "est")—with a random sampling of only "polynomially in log|$V_i$| many entries" over the vector space $V_i$.

Exemplary Methods

Figure 5:
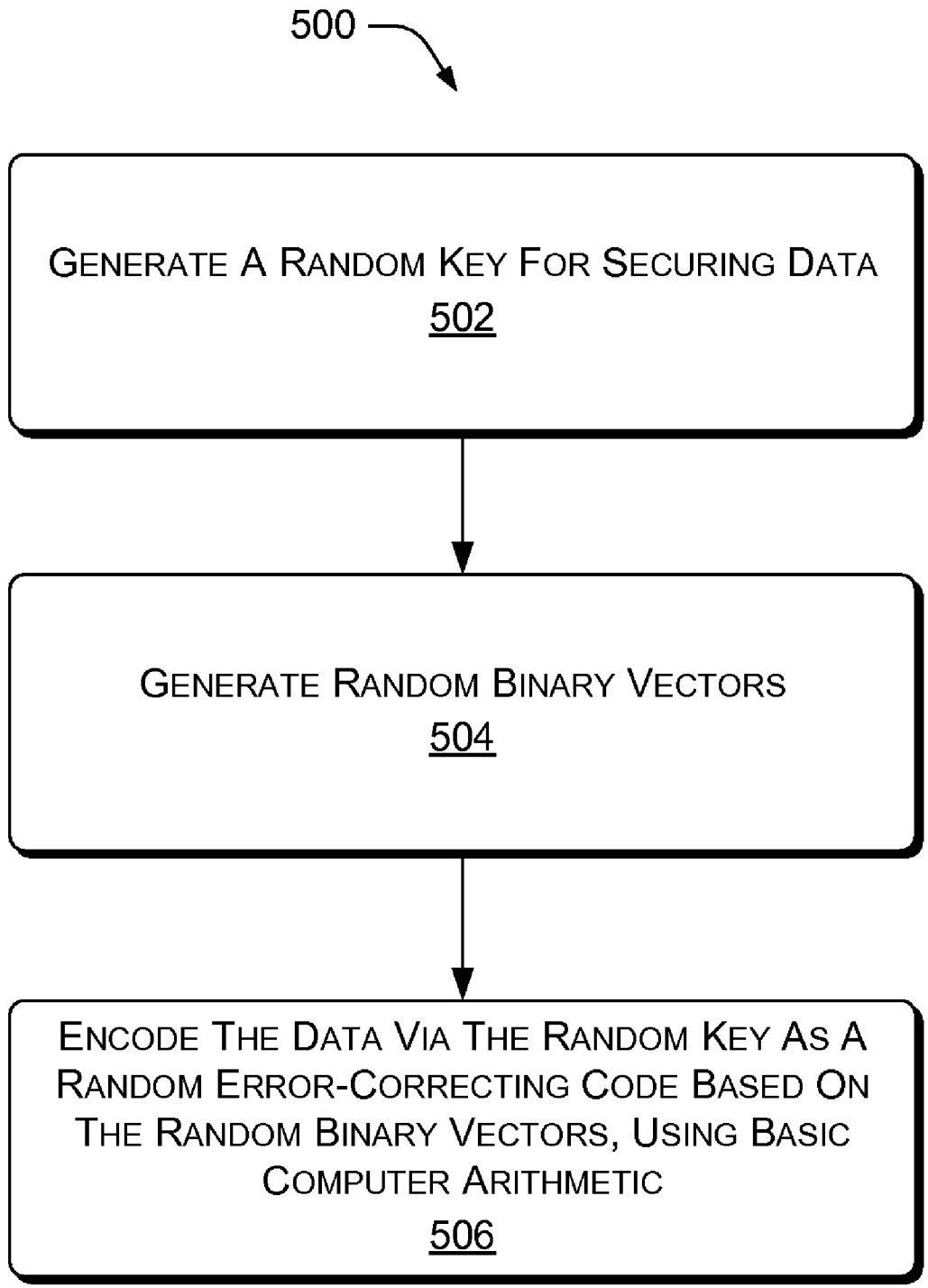
FIG. 5 is a flow diagram of exemplary method of constructing code.

FIG. 5 shows an exemplary method 500 of encoding data. In the flow diagram, the operations are summarized in individual blocks. Depending on implementation, the exemplary method 500 may be performed by hardware, software, or combinations of hardware, software, firmware, etc., for example, by components of the coding engine 110.

At block 502, a random key is generated for securing data. In one implementation, the random key may be part of a McEliece public-key pair. The key will be used to encode message data, such that a recipient who has the key or a part of the key pair will be able to list-decode the original message data from a relatively high level of noise error, while a person who does not possess the key will not. If a key pair is used, then the encoding steps to follow may use the public member of the pair while only those recipients with access to the private component(s) of the pair will be able to decode the received ciphertext.

At block 504, random binary vectors are generated. The random vectors are selected randomly from $\{0,1\}^k$ and can be used to generate the generator matrix (G) which produces an error-correcting code.

At block 506, the message data is encoded as an error-correcting code, but in such a manner that basic computer arithmetic is used in the generation to save energy resources. The random key may also be used in the encoding process. In one implementation, the code is constructed as a function from $\{v+z : v \in V_i, z \in Z_j, 1 \leq i \leq b, 1 \leq j \leq s\} \to \pm 1$ such that $C_x(v+z) = (-1)^{<x, v+y>}$. Thus, the code at this step consists of (+1s) and (−1s). Avoiding the use of finite field arithmetic saves a great deal of energy, allowing the method 500 to be used successfully in very low energy devices, such as smart cards.

Figure 6:
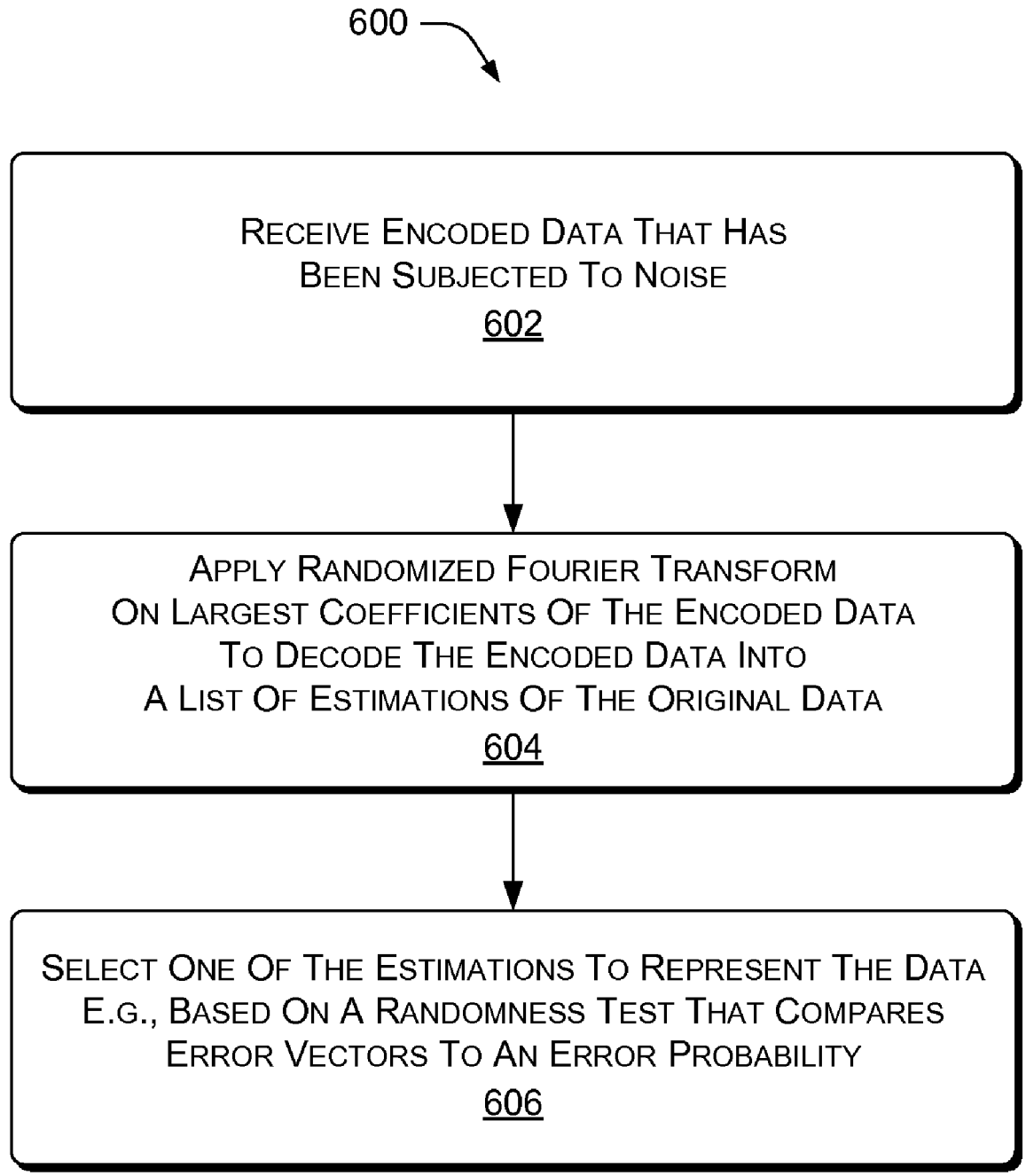
FIG. 6 is a flow diagram of an exemplary method of coding.

FIG. 6 shows an exemplary method 600 of decoding data. In the flow diagram, the operations are summarized in individual blocks. Depending on implementation, the exemplary method 600 may be performed by hardware, software, or combinations of hardware, software, firmware, etc., for example, by components of the coding engine 110.

At block 602, encoded data is received that has possibly been subjected to noise and other transmission errors. That is, the received message consisting of 1's and 0's (or +1's and −1's) may have a number of bits that have been flipped to the opposing binary value. Conventional techniques that return a unique plaintext word for each codeword deciphered can only repair perhaps less than 25% of such errors. Because it is based on a random noise model, the exemplary decoding method 600 can increase the repair rate to just under 50% of errors, while maintaining low energy usage. In one implementation, the error repair is only available to a decoder in possession of the key or secret. Without the key, the received code remains corrupted by any noise or transmission errors encountered during data transfer or added as part of the coding schema.

At block 604, a list of estimations of the original data (i.e., the message or "message word") is generated by subjecting received codewords to a Fourier transform. Each equation imposes a linear constraint on the original data, and the value "est" (Equation (3)) for each such constraint measures confidence in the validity of the constraint. In one implementation, the transform, such as the SRFT, operates only on coefficients that are large beyond a threshold, thereby creating low power, energy efficient decoding. In one implementation, the list of estimations actually contains message words, instead of codewords that would require additional processing resources for their decoding prior to the possibility of selecting a unique codeword from the list as the "correct" match for the original data.

In one implementation, the estimation takes the form of Equation (3) introduced above, namely:

$$est = \Sigma_z \Sigma_{y_1, y_2 \in V_1} w(y_1+z) w(y_2+z) \chi_\alpha(y_1+y_2)$$

where, if $est \geq \frac{3}{4} \cdot \epsilon$ then the equation $\pi_{V_i}(x) = \alpha$ for a given $V_i$ and $\alpha$ is stored, the x of each stored equation being an estimation of the original message data.

At block 606, one of the candidates for representing the original data is selected. The "best match" estimation may be selected by one of a number of alternative techniques. In a first variation, an error vector between the received signal and an original message word that the received signal might represent is determined and a randomness test is applied which estimates the probability that the error vector is close to an error distribution. The x with the maximum probability is selected from the list as the best match for the original data.

Exemplary Computing Device

FIG. 7 shows an exemplary computing device 700 suitable as an environment for practicing the described subject matter. The components of computing device 700 may include, but are not limited to, a processing unit 720, a system memory 730, and a system bus 721 that couples various system components including the system memory 730 to the processing unit 720. The system bus 721 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISAA) bus, Video Electronics Standards Association (VESA) local bus, and Peripheral Component Interconnect (PCI) bus also known as the Mezzanine bus.

Exemplary computing device 700 typically includes a variety of computing device-readable media. Computing device-readable media can be any available media that can be accessed by computing device 700 and includes nonvolatile media, removable and non-removable media. By way of example, and not limitation, computing device-readable media may comprise storage media. Computing device storage media include, removable and non-removable media implemented in any method or technology for storage of information such as computing device-readable instructions, data structures, program modules, or other data. Computing device storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 700.

The system memory 730 includes computing device storage media in the form of volatile and/or nonvolatile memory such as read only memory (ROM) 731 and random access memory (RAM) 732. A basic input/output system 733 (BIOS), containing the basic routines that help to transfer information between elements within computing device 700, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, coding engine 110, application programs 735, other program modules 736, and program data 737.

The exemplary computing device 700 may also include other removable/non-removable computing device storage media. By way of example only, FIG. 7 illustrates a hard disk drive 741 that reads from or writes to non-removable, nonvolatile magnetic media, a magnetic disk drive 751 that reads from or writes to a removable, nonvolatile magnetic disk 752, and an optical disk drive 755 that reads from or writes to a removable, nonvolatile optical disk 756 such as a CD ROM or other optical media. Other removable/non-removable computing device storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface such as interface 750.

The drives and their associated computing device storage media discussed above and illustrated in FIG. 7 provide storage of computing device-readable instructions, data structures, program modules, and other data for computing device 700. In FIG. 7, for example, hard disk drive 741 is illustrated as storing operating system 744, application programs 745, other program modules 746, and program data 747. Note that these components can either be the same as or different from operating system 734, application programs 735, other program modules 736, and program data 737. Operating system 744, application programs 745, other program modules 746, and program data 747 are given different numbers here to illustrate that, at a minimum, they are different copies. A user may enter commands and information into the exemplary computing device 700 through input devices such as a keyboard 748 and pointing device 761, commonly referred to as a mouse, trackball, or touch pad. Other input devices (not shown) may include a microphone, joystick, game pad, satellite dish, scanner, or the like. These and other input devices are often connected to the processing unit 720 through a user input interface 760 that is coupled to the system bus, but may be connected by other interface and bus structures, such as a parallel port, game port, or a universal serial bus (USB). A monitor 762 or other type of display device is also connected to the system bus 721 via an interface, such as a video interface 790. In addition to the monitor 762, computing devices may also include other peripheral output devices such as speakers 797 and printer 796, which may be connected through an output peripheral interface 795.

The exemplary computing device 700 may operate in a networked environment using logical connections to one or more remote computing devices, such as a remote computing device 780. The remote computing device 780 may be a personal computing device, a server, a router, a network PC, a peer device or other common network node, and typically includes many or all of the elements described above relative to computing device 700, although only a memory storage device 781 has been illustrated in FIG. 7. The logical connections depicted in FIG. 7 include a local area network (LAN) 771 and a wide area network (WAN) 773, but may also include other networks. Such networking environments are commonplace in offices, enterprise-wide computing device networks, intranets, and the Internet.

When used in a LAN networking environment, the exemplary computing device 700 is connected to the LAN 771 through a network interface or adapter 770. When used in a WAN networking environment, the exemplary computing device 700 typically includes a modem 772 or other means for establishing communications over the WAN 773, such as the Internet. The modem 772, which may be internal or external, may be connected to the system bus 721 via the user input interface 760, or other appropriate mechanism. In a networked environment, program modules depicted relative to the exemplary computing device 700, or portions thereof, may be stored in the remote memory storage device. By way of example, and not limitation, FIG. 7 illustrates remote application programs 785 as residing on memory device 781. It will be appreciated that the network connections shown are exemplary and other means of establishing a communications link between the computing devices may be used.

CONCLUSION

Although exemplary systems and methods have been described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:

1. A method, comprising:
receiving data;
encoding the data as low dimensional spectral concentration (LDSC) codewords, including:
selecting vectors from a set of low dimensional subspaces;
adding random vectors to scatter the selected vectors over larger subspaces;
representing the codewords as exponents, wherein each exponent comprises one of the scattered vectors multiplied by a vector representing the data; and
sending the codewords as encoded data.

2. The method as recited in claim 1, wherein the method uses basic computer arithmetic to reduce an amount of data processing.

3. The method as recited in claim 1, further comprising generating a random key using a McEliece public-key pair to encrypt the codewords.

4. The method as recited in claim 1, further comprising decoding the codewords, including finding Fourier coefficients representing each codeword, wherein only Fourier coefficients larger than a threshold are used in the decoding.

5. The method as recited in claim 1, wherein encoding the data includes constructing the error-correcting code $C_x$ as a function from $$\{v+z : v \in V_i, z \in z_j, 1 \leq i \leq b, 1 \leq j \leq s\} \rightarrow \pm 1\};$$

wherein $C_x(v+z) = (-1)^{<x, v+y>}$;
wherein $V_i$ comprises i vector spaces of dimension log(k);
wherein $z_j$ comprises s vectors randomly selected form $\{0, 1\}^k$, and
wherein $s = 10/\epsilon^2$, where $\epsilon$ comprises an error probability.

6. The method as recited in claim 1, further comprising selecting one of the estimations to represent the decoded data by applying a message passing technique.

7. The method as recited in claim 1, further comprising increasing an efficiency of encoding by removing a Gaussian elimination during the step of estimating by selecting a standard basis to provide some bits of the decoded data directly.

8. The method as recited in claim 1, further comprising selecting one of the estimations to represent the decoded data by applying a randomness test comprising:
calculating an error vector $e = C_x \cdot w$ between noisy encoded data w and noiseless encoded data $C_x$;
estimating a probability of a closeness parameter comprising a proximity of the error vector e to an error distribution; and selecting one of the estimations to represent the decoded data based on the probability.

9. The method as recited in claim 8, wherein estimating the most probable codeword further comprises finding the number of mean crossings of the closeness parameter.

10. The method as recited in claim 1, further comprising decoding the encoded data that has been subjected to noise, the encoded data subject to noise represented as $w = C_x \cdot \eta$;
wherein $\eta$ represents a noise effect on the encoded data w;
wherein the probability of $\eta$ being (+1) is ($\frac{1}{2}+\epsilon$) and the probability of $\eta$ being (−1) is ($\frac{1}{2}-\epsilon$), where $\epsilon$ represents an error probability parameter.

11. The method as recited in claim 10, wherein the decoding comprises iteratively executing the following steps:

```
for i = 1 to b do
    for α ∈ Vi do
        let est = Σ_z Σ_{y1,y2 ∈ Vi} w(y1 + z)w(y2 + z)χ_α(y1 + y2)

if est ≥ 3/4 · ε then
            store and equation π_{Vi}(x) = α
        end if
    end for
end for;
``` wherein $V_i$ comprises i vector spaces of dimension log(k);
wherein $z_j$ comprises s vectors randomly selected form $\{0, 1\}^k$
wherein $s = 10/\epsilon^2$, where $\epsilon$ comprises an error probability parameter;
wherein n comprises a number of total bits of the encoded data; and
wherein each x from one of the stored equations comprises a candidate match of the data.

12. The method as recited in claim 11, wherein iteratively executing includes randomly sampling polynomially in log|$V_i$| many entries over vector space $V_i$.

13. A system for coding to polynomially sized lists for an error probability of $\frac{1}{2}+\epsilon$, comprising:
a receiver to input message data to be encoded;
a random vector engine to generate random binary vectors; and
a codeword generator to encode the data as a random error-correcting code based on the random binary vectors, wherein the codeword generator uses basic computer arithmetic to reduce processing.

14. The system as recited in claim 13, further comprising a key generator for creating a McEliece public-key pair for encrypting and decrypting the message data to be encoded and list-decoded.

15. The system as recited in claim 13, wherein the codeword generator constructs the error-correcting code $C_x$ as a function from $$\{v+z: v \in V_i, z \in z_j, 1 \leq i \leq b, 1 \leq j \leq s\} \to \pm 1\};$$

wherein $C_x(v+z) = (-1)^{<x, v+y>}$;
wherein $V_i$ comprises i vector spaces of dimension log(k);
wherein $z_j$ comprises s vectors randomly selected form $\{0, 1\}^k$;
wherein $s = 10/\epsilon^2$, where $\epsilon$ comprises an error probability; and
wherein n comprises a number of bits of the encoded data.

16. The system as recited in claim 13, further comprising:
a decoder to process the encoded data that has been affected by noise, represented as $w = C_x \cdot \eta$;
wherein $\eta$ comprises a noise effect on the affected encoded data w ;
wherein the probability of $\eta$ being +1 is $\frac{1}{2}+\epsilon$ and the probability of $\eta$ being −1 is $\frac{1}{2}-\epsilon$, where $\epsilon$ comprises an error probability parameter.

17. The system as recited in claim 16, further comprising a transform-based estimator to decode the encoded data into a list of estimations of the message data based on the coefficients representing the encoded data, wherein only the coefficients larger than a threshold are used in the decoding.

18. The system as recited in claim 17, wherein the decoder performs the transform-based estimation by iteratively executing:

```
fir i = 1 to b do
    for α ∈ Vi do
        let est = Σ_z Σ_{y1,y2 ∈ Vi} w(y1 + z)w(y2 + z)χ_α(y1 + y2)

if est ≥ 3/4 · ε then
            store and equation π_{Vi}(x) = α
        end if
    end for
end for;
``` wherein $V_i$ comprises i vector spaces of dimension log(k);
wherein $z_j$ comprises s vectors randomly selected form $\{0, 1\}^k$;
wherein $s = 10/\epsilon^2$, where $\epsilon$ comprises an error probability;
wherein n comprises a number of total bits of the encoded data; and
wherein each x from one of the stored equations comprises one of the estimations of the data.

19. The system as recited in claim 18, further comprising a randomness tester to calculate an error vector between noisy encoded data and a corresponding noiseless encoded data and to estimate a probability of a closeness of the error vector to an error distribution, wherein the randomness tester selects a unique estimation to represent the message data based on the probability.

20. A system, comprising:
means for constructing a spectrally concentrated code of low dimensional subspace for encoding data, wherein the means for constructing performs calculations using basic computer arithmetic to reduce processing;
means for overcoming noise in a transmission of the spectrally concentrated code including means for applying a randomized Fourier transform to the spectrally concentrated code to establish a list of candidates for the data; and means for selecting one of the candidates to represent the data.

* * * * *

UNITED STATES PATENT AND TRADEMARK OFFICE
CERTIFICATE OF CORRECTION

| | | |
|---|---|---|
| PATENT NO. | : 7,941,726 B2 | |
| APPLICATION NO. | : 11/772049 | |
| DATED | : May 10, 2011 | |
| INVENTOR(S) | : Ramarathnam Venkatesan et al. | |

It is certified that error appears in the above-identified patent and that said Letters Patent is hereby corrected as shown below:

In column 13, line 22, in Claim 11, delete "and" and insert -- an --, therefor.

In column 14, line 27, in Claim 18, delete "and" and insert -- an --, therefor.

Signed and Sealed this
Nineteenth Day of July, 2011

David J. Kappos
*Director of the United States Patent and Trademark Office*